United States Patent [19]

Chatterjee et al.

[11] 4,291,391
[45] Sep. 22, 1981

[54] TAPER ISOLATED RANDOM ACCESS MEMORY ARRAY AND METHOD OF OPERATING

[75] Inventors: Pallab K. Chatterjee, Dallas, Tex.; Geoffrey W. Taylor, Murray Hill, N.J.

[73] Assignee: Texas Instruments Incorporated, Dallas, Tex.

[21] Appl. No.: 75,574

[22] Filed: Sep. 14, 1979

[51] Int. Cl.³ .................... G11C 11/40; G11C 7/00
[52] U.S. Cl. .................................... 365/184; 365/189
[58] Field of Search .................... 365/189, 184, 182

[56] References Cited

U.S. PATENT DOCUMENTS

| | | | |
|---|---|---|---|
| 3,720,925 | 3/1973 | Ross | 365/184 |
| 3,760,378 | 9/1973 | Burns | 365/184 |
| 4,000,504 | 12/1976 | Berger | 357/23 |
| 4,112,507 | 9/1978 | White et al. | 365/184 |

Primary Examiner—Stuart N. Hecker
Attorney, Agent, or Firm—Mel Sharp; Richard Donaldson; Gary C. Honeycutt

[57] ABSTRACT

The present invention is embodied in a method of operating a dynamic random access memory (RAM) array having individual depletion mode metal-oxide-semiconductor (MOS) transistors as the memory cells. The cells can be programmed to two threshold states providing constant current sensing. Cell programming is by application of appropriate signals to the transistor gate electrode and source. Reading is accomplished by grounding the source and sensing current through the transistor. An intermediate voltage on the gate electrode prevents changes in the state of the cell.

8 Claims, 14 Drawing Figures

TAPER ISOLATED RANDOM ACCESS MEMORY ARRAY AND METHOD OF OPERATING

BACKGROUND OF THE INVENTION

This invention is directed to metal-oxide-semiconductor memory devices, and more particularly, to a method of operating an array of random access memory cells where the memory cell is a single MOS transistor.

The earliest semiconductor memories were bipolar, usually transistor - transistor logic (TTL), and were limited in the number of bits. With the development of the MOS technologies bit density has increased dramatically. At the present time N-channel MOS memories are being regularly fabricated with 16,384 bits of memory, and devices with 65,536 bits of memory are beginning to reach the market. Even higher density memories are in the design phase. To meet the demands for high density memories new technologies and device designs have been necessary. Originally, most MOS dynamic RAM's used a three transistor memory cell. This cell is too large for present designs. Today the one transistor-one capacitor cell is standard. Future designs will utilize memory cells using only a single MOS transistor. A one transistor memory cell, similar to the photodetector structure in U.S. Pat. No. 4,000,504 by Berger, is used in the array of the present invention. That structure, however, cannot be used in a memory array without significant changes in its method of operation. Berger's structure, designed as a photodetector uses only the gate electrode to attract or remove holes from beneath the gates. Of course a single electrode cannot be used to select a single cell out of a large array without disturbing other cells.

SUMMARY OF THE INVENTION

The present invention is embodied in a method of operating a dynamic random access memory array having individual depletion mode metal-oxide-semiconductor transistors as the memory cells. The cells can be programmed to two different threshold voltage states. Current flow in the transistor is different in the two states for the application of the same gate voltage. Sensing of the state of the cell is by measuring current flow in the transistor for a constant gate voltage rather than charge sensing. The cell is programmed by application of appropriate signals to the source and the gate electrode of the transistor. Reading is accomplished by grounding the transistor source and sensing the current flow in the transistor for an intermediate gate voltage. The same intermediate gate voltage prevents changes in the state of the cell.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings wherein:

Referring to FIGS. 1 and 2a-2b, an array of four RAM cells is shown. The RAM cells are formed in a semiconductor substrate 10 of one conductivity type, preferably P-type silicon, although N-type silicon and other semiconductor materials may be used. A pair of regions 11,12 of a conductivity type opposite that of the substrate 10 are formed in the substrate 10 and are the source 11 and drain 12 of the transistor 15. The drains 12 in each column are common and form the Y-read lines 16. A first doped region 20 of the opposite conductivity type lies in the substrate 10 between the source 11 and the drain 12. A second doped region 21 of the same type conductivity as the substrate 10 lies between the source 11 and the drain 12 and above the first doped region 20. A thin insulating layer 22, preferably silicon dioxide, lies on the substrate 10 between the source 11 and drain 12 to form the gate dielectric of the transistor 15. A thick layer 24 of silicon dioxide, thick field oxide, lies partially above and partially below the surface of the substrate 10 and is adjacent to the source 11 and the drain 12. Channel stop regions 25 of the same conductivity type as the substrate 10 lie in the substrate 10 beneath the thick oxide layer 24. Conductive strips 13,17, formed preferably from a layer 26 of polycrystalline silicon, are disposed on the thin insulating layer 22 and part of the thick field oxide 24. These conductive strips 13,17 form the Y-write lines 17 and the gate electrodes 13 of the transistor 15. An insulating layer 27 known as multilevel oxide, and preferably phosphorous glass, lies upon the polycrystalline silicon 26 and the rest of the device except where contacts are located. Other conductive strips 18 formed preferably from a layer 28 of aluminum, lie upon the multilevel oxide 27 and form the X-select lines 18.

FIG. 3 is an electrical schematic of the array of RAM cells of FIG. 1.

Referring to FIGS. 2a-2b, a process for making the RAM of FIGS. 1 and 3 is described hereinafter. The starting material is a monocrystalline semiconductor substrate or slice 10, preferably p-type silicon, although n-type silicon and other semiconductor materials could be used. A thin layer of silicon dioxide is grown upon the substrate 10, followed by the deposition of a silicon nitride layer. The oxide and nitride layers are patterned using conventional photolithographic techniques leaving the silicon material of the substrate 10 exposed in areas where a guard ring implant is desired. The slice is subjected to a boron implant followed by a long oxidation to form diffused channel stoppers 25, beneath thick field oxide regions 24. The nitride and thin oxide layers are removed followed by the growth of a thin oxide layer 22. A photoresist layer is applied and patterned with photoresist covering all areas of the slice except the RAM array where all the photoresist is removed. The slice is implanted at high energy with an n-type impurity such as arsenic to form the buried channel 20 between the sources 11 and the drains 12. Next the slice is implanted at low energy with a p-type impurity such as boron to form the layer 21 between the sources 11 and the drains 12 and above the n-type implanted layer 20. The photoresist is then removed and a layer 26 of polycrystalline silicon is deposited upon the slice. The polycrystalline silicon 26 will form the gates 13, gate interconnects and Y-write lines 17. The polycrystalline silicon 26 and the thin oxide layer 22 are patterned leaving bare silicon 10 where the source/drain areas 11,12 are desired. The source/drain areas 11,12 are formed, preferably by the the implant of phosphorus into the substrate 10, although other impurities and dopant methods could be used. Next, a layer 27 of multilevel oxide is formed upon the slice 10. The multilevel oxide 27 is usually phosphorus glass although other multilevel insulators may be used. The slice is subjected to a high temperature furnace treatment to reflow the multilevel oxide 27. Contacts are cut in the multilevel oxide 27 followed by the deposition and patterning of a metallization layer 28, preferably aluminum, to complete the process.

The operation of the single transistor dynamic RAM memory cell can be understood by referring to FIGS. 4a-4d. FIG. 4b is a plot of the surface potential distribution $\phi_S$ across the width of the transistor in FIG. 4a when there is a small (approximately 2.2-2.5 volts) potential on the gate electrode 13. This would correspond to the voltage $V_G$ (store) applied to the gate electrode 13 when the cell is in either the "0" or "1" state. The cell is in the "0" state when there are no holes in the potential well 35 beneath the gate electrode 13. The cell is in the "1" state when holes are in the potential well 35. It is clear from examining the potential distribution of FIG. 4b that if a hole is in the potential well 35, it could not escape because of the potential barriers 30. Of course, it must be remembered that the potential distribution in FIG. 4b (and also FIGS. 4c and 4d) is only in one dimension, along the line b—b in FIG. 1. Examination of the potential across the length of the transistor along line a—a in FIG. 1 and along a line from the surface of the slice down into the substrate 10 shows that there are hole potential barriers caused by the n+ source 11 and drain 12, and by the n-type channel 20. Therefore, once a hole is placed in the potential well 35, it will remain there until the gate potential is changed from that of FIG. 4b.

Figure 1:
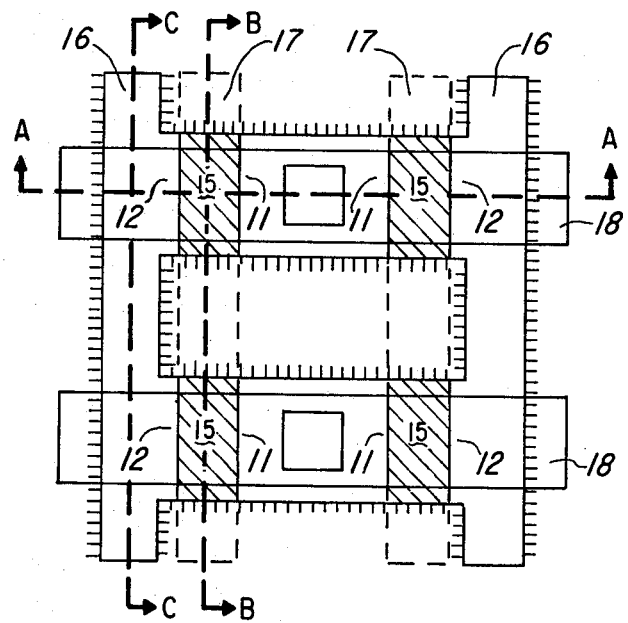
FIG. 1 is a greatly enlarged plan view of a small portion of a semiconductor chip showing the physical layout of four random access memory cells.
Figure 3:
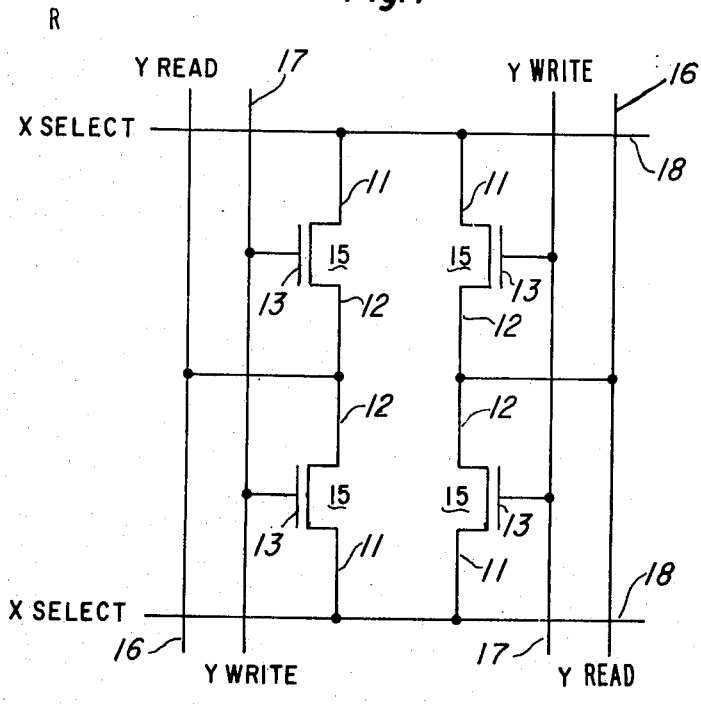
FIG. 3 is an electrical schematic of the memory cells of FIG. 1.
Figure 2A:
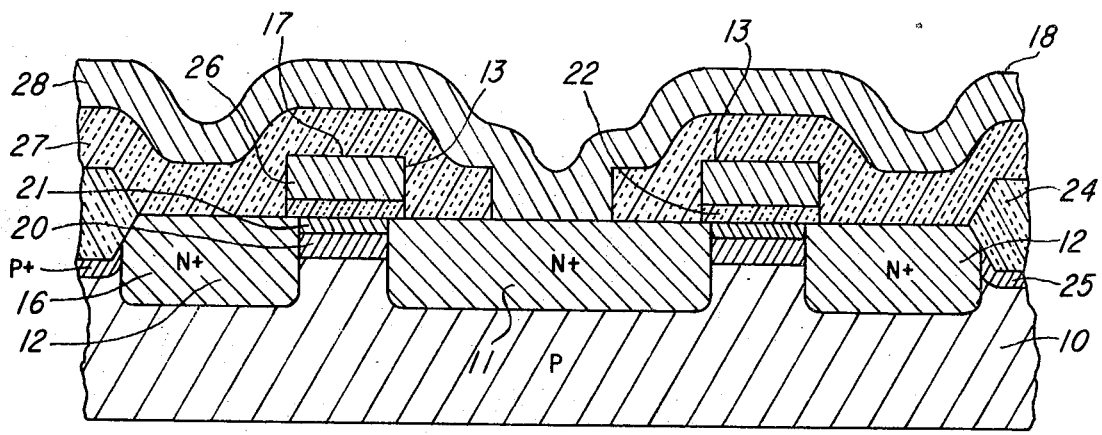
FIGS. 2a-2c are cross-sectional views of the memory cells of FIG. 1, taken along the lines a—a, b—b and c—c respectively.
Figure 2B:
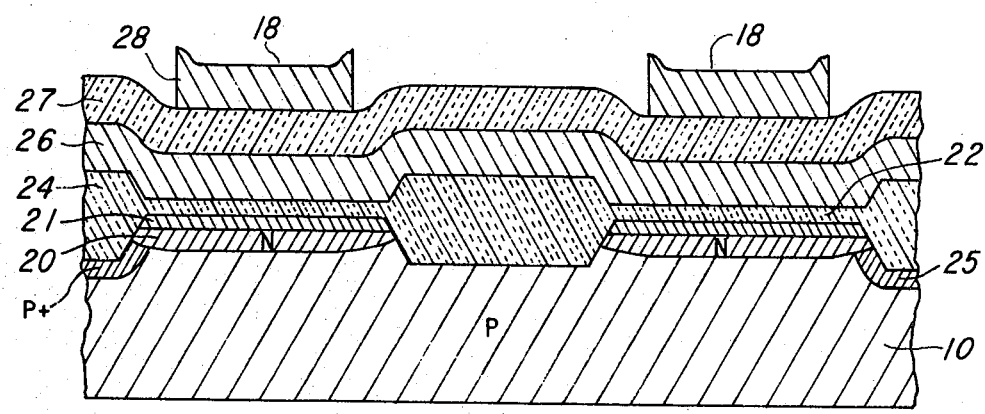
Figure 2C:
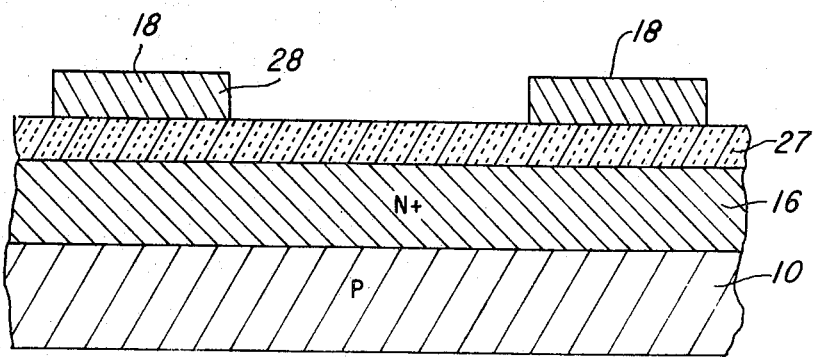
Figure 4A:
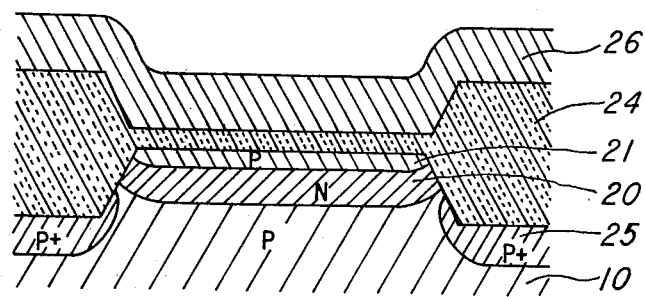
FIG. 4a is an enlarged fragmentary view of a portion of the cross-section of FIG. 2b.
Figure 4B:
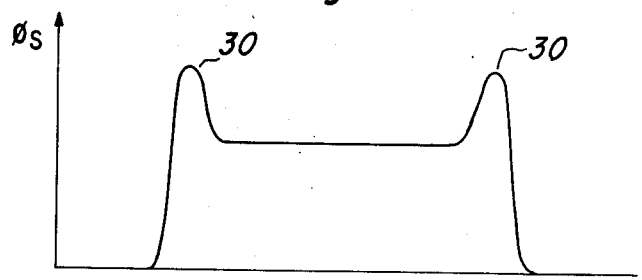
FIGS. 4b-4d are plots of the substrate surface potential distribution $\phi_S$ across the width of the transistor of FIG. 4a, taken at different gate potentials.
Figure 4C:
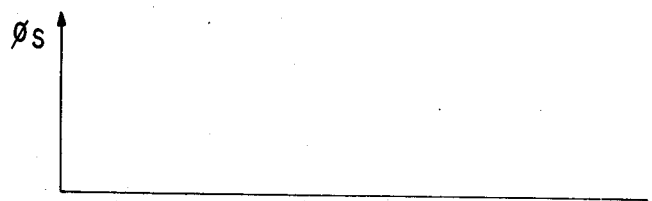

To "write" a "1" into a memory cell, holes must be placed in the potential well 35. This is accomplished by taking the gate electrode 13 to a negative potential $V_G$ ("1"). Once the potential barriers 30 have been reduced to the substrate potential, holes will flow from the substrate 10 or the channel stoppers 25 into the area beneath the gate electrode 13. The surface potential distribution $\phi_S$ during the time a "1" is written is shown in FIG. 4c. Note that the surface potential can never go below the substrate potential because holes will flow from the substrate 10 to clamp the potential at the substrate potential. After holes have been attracted into the area beneath the gate electrode 13, the potential on the gate electrode 13 is then brought back to $V_G$ (store). This again gives the surface potential distribution $\phi_S$ of FIG. 4b with holes now in the potential well 35.

Figure 4D:
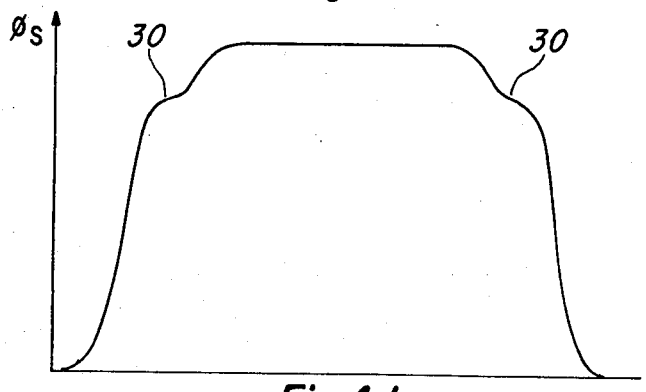

To "write" a "0" into the memory cell, the holes that have been placed in the cell must be removed. This is accomplished by taking the gate electrode 13 to a positive potential $V_G$ ("0"). This gives a surface potential distribution $\phi_S$ as shown in FIG. 4d. It is clear from FIG. 4d that under these conditions the hole barriers 30 have disappeared. Therefore, any holes in the well will now diffuse into the substrate 10. After the holes have been removed from the area beneath the gate electrode 13, the potential on the gate electrode 13 is brought back to $V_G$ (store). This gives a surface potential distribution $\phi_S$ of FIG. 4b with no holes in the potential well 35.

"Reading" of information in the memory cell is accomplished in the following manner. The memory cell transistors 15 operate in the depletion mode because of the buried channel region 20. Consequently, at zero gate potential, current will flow from source 11 to drain 12 when a potential is applied between source 11 and drain 12. When the potential well 35 is empty (i.e., no holes) an amount of current will flow from the source 11 to drain 12. This amount of current represents a stored "0" in the cell. When holes are stored in the potential well 35, a larger source-to-drain current will flow from the same applied potential from source 11 to drain 12, than when there are no holes in the potential well 35. This amount of current represents a stored "1" in the cell. The reason a larger source-to-drain current will flow when holes are stored in the well 35 can be seen from examining FIG. 4a. The stored holes are represented by positive charge above the buried channel 20. The effect of the stored holes is the same as making the threshold voltage of the transistor more negative, which, of course at the same gate voltage increases the source-to-drain current on an n-channel transistor. The different source-to-drain currents can be detected by a sense amplifier to determine the state of the memory cell (i.e. to "read" the information in the cell).

Figure 5A:
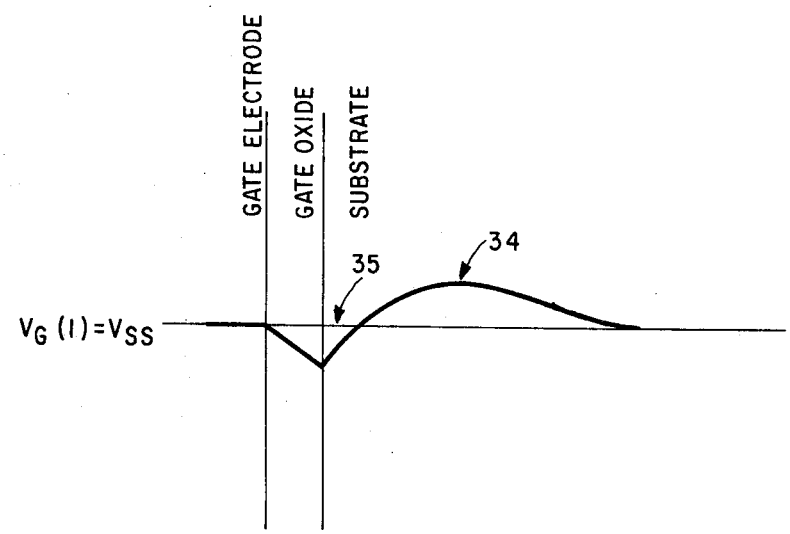
FIGS. 5a-5b are plots of the potential distribution in the device of FIG. 4a when a "1" is being written.
Figure 5B:
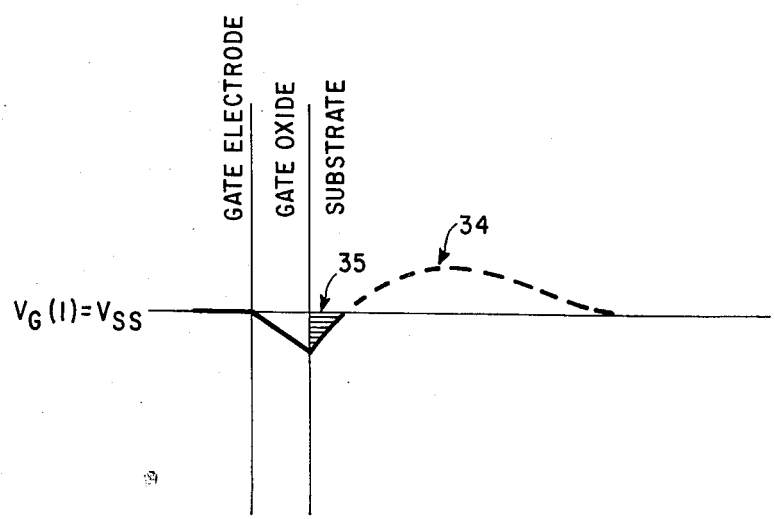
Figure 6A:
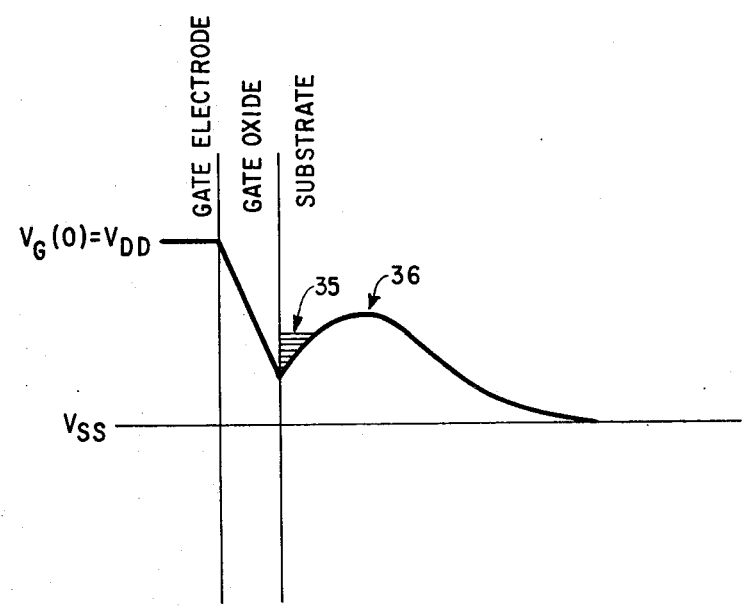
FIGS. 6a-6b are plots of the potential distribution in the device of FIG. 4a when a "0" is being written.
Figure 6B:
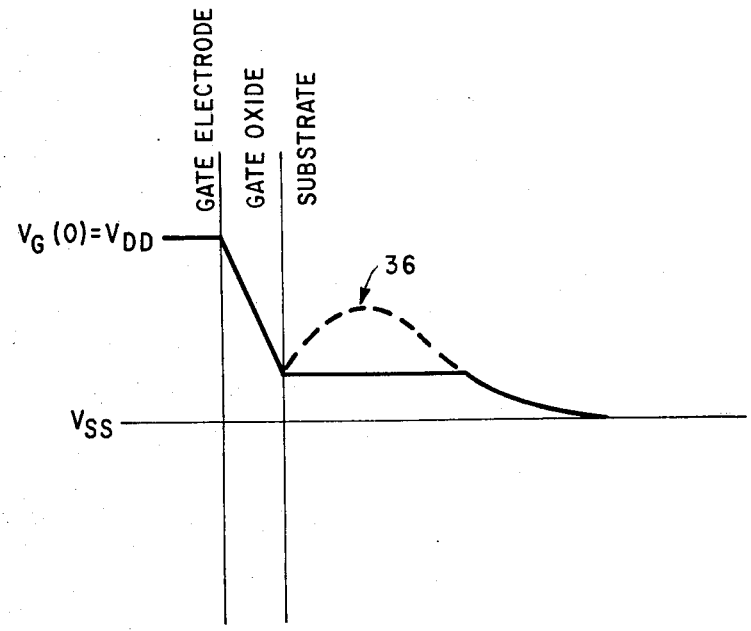

Although the above described method of "reading" and "writing" information will work for an individual memory cell, it will not work with an array of cells. With arrays there must be a selective "read" and "write" scheme. That is, there must be a way to select an individual cell in the array to "write" information into or "read" information from. In the above described method, the potential on the gate electrode 13 only was changed to store holes in or remove holes from the potential well 35 beneath the gate electrode 13 (i.e. to "write" information into the cell). With an array of memory cells, there must be two signals applied to "write" information into a specific cell without affecting the state of the other cells. The "writing" of information into a single memory cell by the use of a signal applied to two of the memory cell terminals can be understood by referring to FIGS. 5a-5b and 6a-6b. This is the same "writing" scheme that is used in array operation. The terminals of the cell (i.e. transistor 15) to be addressed are the gate electrode 13, which in the array is connected to Y-write 17, and the source 11, which in the array is connected to X-select. It should be kept in mind during the following discussion that when reference is made to a potential being applied to the gate electrode 13 or source 11 that in the array operation the same potentials would be applied to Y-write 17 and X-select 18 respectively. As previously stated, a "0" state in the cell corresponds to an absence of stored holes beneath the gate electrode 13 whereas a "1" corresponds to stored holes. In the following discussion, it will be assumed that when a "0" is written, a "1" was in the cell previously, and when a "1" is written, it will be assumed a "0" was in the cell. FIGS. 5a–5b demonstrate the "writing" of a "1" into the memory cell, both figures being plots of potential from the gate electrode 13 through the gate oxide 22 and into the substrate 10. FIG. 5a shows the potential distribution when a potential $V_G$ ("1")=$V_{SS}$ (usually ground) is applied to the gate electrode 13 while the potential on the source 11 is $V_{DD}$ (usually 5.0 volts). Under these conditions, there is a barrier 34 to any flow of holes from the substrate 10 into the potential well 35 and consequently no holes can be put into the well 35 under these conditions. However, when the potential on the source 11 is brought to $V_{SS}$ as shown in FIG. 5b, the hole barrier 34 disappears and holes will flow from the substrate 10 into the potential well 35. The dashed line represents the removed barrier 34, and the lines in the potential well 35 represent holes in the well 35. To "write" a "0" into the memory cell, the holes must be removed from the potential well 35. This can be demonstrated by referring to FIGS. 6a–6b. FIG. 6a shows the potential distribution when a potential $V_G$ ("0")=$V_{DD}$ is applied to the gate electrode 13 while the potential on the source 11 is $V_{DD}$. Under these conditions, there is a barrier 36 to any flow of holes from the potential well 35 into the substrate 10. Consequently holes will remain in the well 35. However, when the potential on the source 11 is brought to $V_{SS}$ as shown in FIG. 6b, the barrier 36 is removed and holes will flow out of the potential well 35 into the substrate 10 leaving the cell in the "0" state. The dashed line represents the removed barrier 36. Thus, FIGS. 5a–5b and 6a–6b clearly demonstrate two-terminal "writing" of information in a memory cell, a prerequisite for utilization of the cell in a memory array. It should be noted that in the discussion with reference to FIGS. 5a–5b, the potential $V_G$("1") was taken to $V_{SS}$ instead of the negative voltage that was used when "writing" was done by using the gate electrode 13 only. This was accomplished by adjusting the p-type implant in the second implanted region 21 so there is a negative surface potential $\phi_S$ when the gate voltage is $V_{SS}$. If this had not been done, the gate voltage would have had to be taken negative with respect to the substrate 10, an unacceptable operating condition for n-channel logic.

"Reading" is accomplished in the same manner as before, by sensing the different amounts of current flowing from source-to-drain when a potential is applied between source 11 and drain 12. Alternatively, "reading" could be accomplished by passing the source-to-drain current through a load resistor and sensing the different voltages on the resistor. Either the different currents or different voltages correspond to different states of the memory cell.

Figure 7:
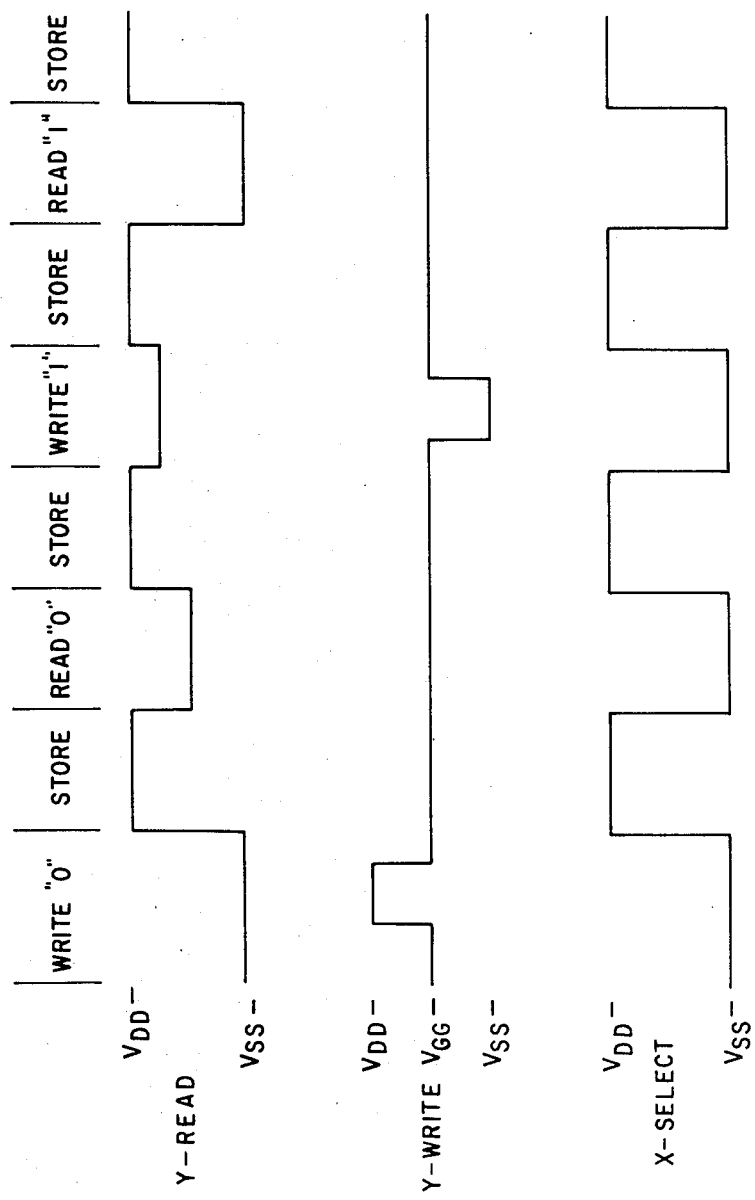
FIG. 7 is a clocking sequence for operation of the memory array.

The operation of an array of memory cells using the previously described two terminal addressing scheme can be seen by examining the waveforms of FIG. 7. FIG. 7 shows the signals on the X-select line 18, the Y-read line 16, and the Y-write line 17 during the "read", "write", and "store" cycles. The Y-read line 16 is connected to $V_{DD}$ through a load resistor. To "write" a "0" in a selected cell, the X-select line 18 connected to the selected cell is taken to $V_{SS}$. Then the Y-write line 17 connected to the selected cell is taken to $V_{DD}$. After the "0" is written, the voltage on the Y-write line 17 connected to the selected cell is brought to $V_{GG}$, a voltage intermediate (approximately 2.2–2.5 volts) between $V_{DD}$ and $V_{SS}$. After Y-write line 17 connected to the selected cell is taken to $V_{GG}$, the X-select line 18 connected to the selected cell is brought to $V_{DD}$ and the cell is now in the "store" mode. To "write" a "1" in a selected cell the X-select line 18 connected to the selected cell is taken to $V_{SS}$ and the Y-write line 17 connected to the selected cell is then brought to $V_{SS}$. The Y-write line 17 connected to the selected cell is then brought back to $V_{GG}$ and subsequently the X-select line 18 connected to the selected cell is brought to $V_{DD}$. At this point the cell is in the "1" state because of the holes in the well 35 beneath the gate electrode 13. To "read" the state of a particular cell, it is only necessary to bring the X-select line 18 connected to the selected cell to $V_{SS}$ while the voltage on the Y-write line 17 connected to the selected cell remains at $V_{GG}$. If there is a "1" in the cell, the voltage on the Y-read line 16 connected to the selected cell will be larger than if there is a "0" in the cell. This happens for the reasons previously explained; that is, the existence of holes in the well 35 beneath the gate electrode 13 increases the current flow in the cell transistor 15 for a given gate 13 voltage.

When either "reading" or "writing", the voltage on the Y-write lines 17 and the X-select lines 18 which are not connected to the selected cell will remain at $V_{GG}$ and $V_{DD}$ respectively. This is one of the more important factors in getting the individual memory cell to operate in an array. When the voltage on Y-write 17 is at $V_{GG}$, holes cannot be added to or removed from the potential well 35 beneath the gate electrode 13 irrespective of what voltage changes occur on X-select 18. By maintaining X-select 18 at $V_{DD}$ no imformation can be written into a cell irrespective of the voltage on Y-write 17 of that particular cell. These features allow an individual cell to be selected out of an array by proper selection of X-select 18, Y-write 17 and Y-read 16. For example, "writing" information into a particular cell requires the application of signals to the appropriate Y-write line 17 and X-select line 18, while maintaining the unselected Y-write lines 17 at $V_{GG}$ and the unselected X-select lines 18 at $V_{DD}$. "Reading" information from a particular cell requires the selection of the appropriate Y-read line 16 and X-select line 18, while maintaining the unselected Y-write lines 17 at $V_{GG}$ and the unselected X-select lines 18 at $V_{DD}$.

Another consideration when operating a memory array is that no voltages on the chip should be lower than the substrate 10 voltage. If a voltage less than the substrate 10 voltage should be applied to a source 11 and/or drain 12, the source/drain-substrate diodes would become forward biased and power dissipation on the chip would be increased. It should be recalled that in describing the operation of the individual cell by use of the gate electrode 13 alone, the gate 13 voltage was taken negative with respect to the substrate 10 to put holes in the well 35. To alleviate this problem, the implant in the p-type second implanted region 21 can be adjusted so that there is a negative surface potential $\phi_S$ when the gate voltage is $V_{SS}$. This will eliminate the need for any voltages on the chip lower than the substrate voltage.

There are several advantages to operating a memory array in this manner. The first advantage is that it allows the use of a single depletion mode metal-oxide-semiconductor transistor as the memory cell, the structure of which is shown in FIGS. 1 and 2a–2c. This single transistor cell is extremely small and allows high packing density. Another advantage is that the effects of minority carrier (electron) leakage currents caused by alpha particles and thermal generation of electron-hole pairs in the substrate are minimized. The electrons in the substrate normally tend to diffuse toward the potential well where they would recombine with the holes in the potential well (assuming the cell is in the "1" state) and change the "1" to a "0". This result is prevented by the operation of this cell in the manner which is the subject of this invention. In the "store" mode the potential on the X-select lines 18 is at $V_{DD}$. This same voltage is also on the sources 11 (and the drains 12 and first implanted regions 20 because they are all electrically connected) and consequently has the effect of repelling any minority carriers (electrons) away from the potential well 35.

While this invention has been described with reference to illustrated embodiments, it is not intended that this description be construed in a limiting sense. Various modifications of the illustrated embodiments, as well as other embodiments of the invention, will be apparent to persons skilled in the art upon reference to this description. It is therefore contemplated that the appended claims will cover any such modifications of embodiments as fall within the true scope of the invention.

What we claim is:

1. A method of operating an X-Y array of semiconductor random access memory cells by writing information into, storing information in, and reading information out of a single cell in the array without disturbing the state of other cells in the array, wherein each memory cell has a single depletion mode, buried channel, metal-oxide-semiconductor transistor with a source, drain, and gate, the array being arranged in rows and columns of memory cells, all the drains in each column of the array being connected to a Y-read line for that column, all the sources in each row of the array being connected to an X-select line for that row, and all the gates in each column of the array being connected to a Y-write line for that column, said method comprising:

applying appropriate signals to a particular X-select line and a particular Y-write line, and sensing the signal on a Y-read line corresponding to the selected single cell while maintaining the potential at a high reference voltage magnitude $V_{DD}$ on all other X-select lines and while maintaining the potential at an intermediate voltage magnitude $V_{GG}$ less than $V_{DD}$ but greater than a low reference voltage magnitude $V_{SS}$ on all other Y-write lines.

2. A method as set forth in claim 1, wherein the applying of appropriate signals to a particular X-select line and a particular Y-write line and the sensing of the signal on a Y-read line corresponding to the selected single cell comprise:

applying appropriate signals to the particular X-select line and the particular Y-write line to write information into said selected cell;

applying appropriate signals to the particular X-select line and the particular Y-write line to store information in said selected cell; and applying an appropriate signal on the particular X-select line and sensing the signal on the Y-read line corresponding to said selected cell to read the information in said selected cell.

3. A method as set forth in claim 2, wherein the applying of appropriate signals to write information into said selected cell comprises:

imparting a potential of a voltage magnitude $V_{SS}$ to the particular X-select line and at the same time or subsequent thereto, imparting a potential of a voltage magnitude $V_{DD}$ to the particular Y-write line, and then changing the potential on the particular Y-write line to a voltage magnitude $V_{GG}$ to write a "0" into said selected cell; and imparting a potential of a voltage magnitude $V_{SS}$ to the particular X-select line and at the same time or subsequent thereto, imparting a potential of a voltage magnitude $V_{SS}$ to the particular Y-write line, and then changing the potential on the particular Y-write line to a voltage magnitude $V_{GG}$ to write a "1" into said selected cell.

4. A method as set forth in claim 2, wherein the applying of appropriate signals to store information in said selected cell comprises:

imparting a potential of a voltage magnitude $V_{GG}$ to the particular Y-write line and imparting a potential of a voltage magnitude $V_{DD}$ to the particular X-select line to store information in said selected cell.

5. A method as set forth in claim 2, wherein the applying of an appropriate signal on the particular X-select line and the sensing of the signal on the Y-read line corresponding to said selected cell to read the information in said selected cell comprise:

imparting a potential of a voltage magnitude $V_{SS}$ to the particular X-select line, imparting a potential of a voltage magnitude $V_{GG}$ to the particular Y-write line, and sensing the current flow on the Y-read line corresponding to said selected cell to read the information in said selected cell.

6. A method as set forth in claim 2, wherein the applying of an appropriate signal on the particular X-select line and the sensing of the signal on the Y-read line corresponding to said selected cell to read the information in said selected cell comprise:

imparting a potential of a voltage magnitude $V_{SS}$ to the particular X-select line, imparting a potential of a voltage magnitude $V_{GG}$ to the particular Y-write line, directing the source-to-drain current of said selected cell through a load resistor, and sensing the potential of a voltage magnitude corresponding to one or the other states of said selected cell from the load resistor to read the information in said selected cell.

7. A random access memory device comprising:

a substrate of a semiconductor material of a first conductivity type;

an array of insulated gate field effect transistors as memory cells arranged in an X-Y matrix of rows and columns on said substrate;

each memory cell including a pair of spaced doped regions in said substrate extending to a surface thereof and being of the opposite conductivity type, said doped regions forming a source and drain of a transistor, a buried doped region of said opposite conductivity type disposed wholly below the surface of said substrate and extending between and interconnecting said source and drain, a surface region of said first conductivity type defined along said surface of said substrate and disposed directly above said buried doped region, said surface region of said first conductivity type being in contact with said buried doped region and extending between said source and drain, a gate insulation layer upon said surface of said substrate and extending between said source and drain in overlying relation to said surface region of said first conductivity type, and a conductive member upon said gate insulation layer and forming the gate electrode of the transistor;

said gate electrodes in each one of one of said rows and columns of the X-Y matrix being included in a common first conductive strip and forming a write line such that a plurality of first conductive strips forming write lines corresponding to the said one of said rows and columns are provided;

said drains of said memory cells included in each of the said one of said rows and columns of the X-Y matrix being defined by a common doped region and forming a read line for each of the said one of said rows and columns;

an insulating layer disposed on said plurality of first conductive strips forming the gate electrodes of the transistors included in the X-Y matrix and having a plurality of apertures in registration with said sources of said transistors; and a plurality of second conductive strips disposed on said insulating layer and respectively covering the apertures of each of said sources included in a common one of the other of said rows and columns and electrically contacting said sources to form a plurality of select lines respectively corresponding to each of the said other of said rows and columns;

means for applying a first voltage $V_{SS}$ to a particular select line corresponding to a selected single cell in the write and read modes of operation;

means for alternatively applying said first voltage $V_{SS}$ or a second voltage $V_{DD}$ higher than said first voltage $V_{SS}$ to a particular write line corresponding to said selected single cell in the write mode depending upon whether a binary "1" or a "0" is to be written into said selected single cell;

means for applying a third voltage $V_{GG}$ intermediate in magnitude to said first voltage $V_{SS}$ and said second voltage $V_{DD}$ to said particular write line corresponding to said selected single cell in the read mode and in the store mode;

means for applying said second voltage $V_{DD}$ to said particular select line corresponding to said selected single cell in the store mode; and means for maintaining said second voltage $V_{DD}$ on the remaining select lines and said third voltage $V_{GG}$ on the remaining write lines to retain all of the memory cells of said array other than said selected single cell in their present state.

8. A random access memory device as set forth in claim 7, wherein the one and the other of said rows and columns respectively comprise columns and rows such that said plurality of first conductive strips which respectively include common gate electrodes form a plurality of Y-write lines corresponding to the columns;

the respective common doped regions defining said drains of said memory cells form a plurality of Y-read lines corresponding to the columns; and said plurality of second conductive strips respectively cover the apertures of each of said sources included in a common row and electrically contact said sources to form a plurality of X-select lines corresponding to the rows.

* * * * *